(12) United States Patent
Gupta et al.

(10) Patent No.: US 10,673,230 B2
(45) Date of Patent: Jun. 2, 2020

(54) BIPOLAR DC POWER TRANSMISSION SCHEME

(71) Applicant: General Electric Technology GmbH, Baden (CH)

(72) Inventors: Robin Gupta, Stafford (GB); Robert Stephen Whitehouse, Stafford (GB)

(73) Assignee: General Electric Technology GmbH, Baden (CH)

( * ) Notice: Subject to any disclaimer, the term of this patent is extended or adjusted under 35 U.S.C. 154(b) by 0 days.

(21) Appl. No.: 15/569,860

(22) PCT Filed: Apr. 26, 2016

(86) PCT No.: PCT/EP2016/059318
§ 371 (c)(1),
(2) Date: Oct. 27, 2017

(87) PCT Pub. No.: WO2016/174044
PCT Pub. Date: Nov. 3, 2016

(65) Prior Publication Data
US 2018/0115152 A1 Apr. 26, 2018

(30) Foreign Application Priority Data

Apr. 28, 2015 (GB) .................................. 1507179.8

(51) Int. Cl.
*H02H 7/26* (2006.01)
*G01R 19/14* (2006.01)
(Continued)

(52) U.S. Cl.
CPC ............. *H02H 7/268* (2013.01); *G01R 19/14* (2013.01); *G01R 31/50* (2020.01); *H02H 3/06* (2013.01);
(Continued)

(58) Field of Classification Search
CPC .......... H02H 7/268; H02H 3/06; H02H 3/063; G01R 19/14; G01R 31/025; H02J 3/36;
(Continued)

(56) References Cited

U.S. PATENT DOCUMENTS 3,968,419 A * 7/1976 Ekstrom .................. H02J 3/36
363/50
5,243,293 A * 9/1993 Isozaki ................ G01R 15/246
324/244.1
(Continued)

FOREIGN PATENT DOCUMENTS

| WO | 2013/131782 A1 | 9/2013 |
| WO | 2013/174726 A1 | 11/2013 |
| WO | 2014/121438 A1 | 8/2014 |

OTHER PUBLICATIONS

Combined Search and Examination Report issued in connection with corresponding GB Application No. 1507179.8 dated Oct. 30, 2015.

(Continued)

*Primary Examiner* — Gary L Laxton
*Assistant Examiner* — Ivan Laboy
(74) *Attorney, Agent, or Firm* — Eversheds Sutherland (US) LLP

(57) ABSTRACT

A bipolar DC power transmission scheme comprises: DC poles, each including a respective power transmission medium extending between two ends; a plurality of converters, wherein each end of the power transmission medium of the first pole is respectively operatively connected to a converter, and each end of the power transmission medium of the second pole is respectively operatively connected to a converters; a controller programmed to block one or more of the converters in response to a fault occurring on either of the first and second poles; and a monitoring device configured to identify the faulty poles on which the fault has (Continued)

occurred, wherein the controller is further programmed to deblock the or each blocked converter connected to the other of the poles after the monitoring device has identified the faulty one of the poles on which the fault has occurred.

13 Claims, 7 Drawing Sheets

(51) Int. Cl.
    *G01R 31/02*     (2006.01)
    *H02H 3/06*     (2006.01)
    *H02J 3/36*     (2006.01)
    *H02M 5/458*     (2006.01)
    *H02M 1/32*     (2007.01)
    *G01R 31/50*     (2020.01)
    *H02H 3/16*     (2006.01)

(52) U.S. Cl.
    CPC ............... *H02H 3/063* (2013.01); *H02J 3/36* (2013.01); *H02M 5/4585* (2013.01); *H02H 3/16* (2013.01); *H02M 1/32* (2013.01); *Y02E 60/60* (2013.01)

(58) Field of Classification Search
    CPC ...... H02M 5/4585; H02M 7/483; H02M 7/49; H02M 2007/4835
    See application file for complete search history.

(56) References Cited

U.S. PATENT DOCUMENTS

| | | | |
|---|---|---|---|
| 2009/0168468 A1* | 7/2009 | Radbrant | H02J 3/36 363/35 |
| 2009/0201702 A1* | 8/2009 | Radbrant | H02J 3/36 363/35 |
| 2009/0316446 A1* | 12/2009 | Astrom | H02H 7/268 363/35 |
| 2013/0162035 A1* | 6/2013 | Sullivan | H02H 7/261 307/18 |
| 2015/0015066 A1 | 1/2015 | Dong et al. | |
| 2015/0070802 A1 | 3/2015 | Dong et al. | |
| 2017/0133834 A1* | 5/2017 | Blug | H02H 3/087 |
| 2017/0331281 A1* | 11/2017 | Whitehouse | H02H 7/268 |

OTHER PUBLICATIONS

International Search Report and Written Opinion issued in connection with corresponding PCT Application No. PCT/EP2016/059318 dated Aug. 26, 2016.

International Preliminary Report on Patentability issued in connection with corresponding PCT Application No. PCT/EP2016/059318 dated Oct. 31, 2017.

* cited by examiner

BIPOLAR DC POWER TRANSMISSION SCHEME

FIELD OF INVENTION

This invention relates to a bipolar DC power transmission scheme and a method of operating a bipolar DC power transmission scheme.

BACKGROUND OF THE INVENTION

It is known to use a bipolar DC power transmission scheme to transmit power at high voltage levels over long distances.

BRIEF DESCRIPTION OF THE INVENTION

According to a first aspect of the invention, there is provided a bipolar DC power transmission scheme comprising: first and second DC poles, each DC pole including a respective DC power transmission medium extending between two ends; a plurality of first converters and a plurality of second converters, wherein each end of the DC power transmission medium of the first DC pole is respectively operatively connected to at least one of the plurality of first converters, and each end of the DC power transmission medium of the second DC pole is respectively operatively connected to at least one of the plurality of second converters; a controller programmed to block one or more of the plurality of first and second converters in response to a fault occurring on either of the first and second DC poles; and a monitoring device configured to identify the faulty one of the first and second DC poles on which the fault has occurred, wherein the controller is further programmed to deblock the or each blocked converter connected to the healthy other of the first and second DC poles after the monitoring device has identified the faulty one of the first and second DC poles on which the fault has occurred.

The conventional response to a fault on a DC pole of a bipolar DC power transmission scheme involves blocking the converters connected to the faulty DC pole and tripping associated circuit breakers to clear the faulty DC pole. Although the healthy DC pole is normally expected to be unaffected by the fault and thereby able to continue transmitting power, the inventors have found that the mutual coupling between the faulty and healthy DC poles may result in strong dynamics in the converters connected to the healthy DC pole that leads to overcurrent and/or overvoltage, which not only interferes with the power transmission operation but also increases the risk of damage to the converters connected to the healthy DC pole.

The inclusion of the controller and monitoring device in the bipolar DC power transmission device permits temporary blocking of one or more converters connected to the healthy DC pole and thereby reduce the adverse effects resulting from the mutual coupling between the faulty and healthy DC poles. This thereby permits operation of the converters connected to the healthy DC pole within safe operating limits whilst minimising power transmission interruption, i.e. permitting the converters connected to the healthy DC pole to continue power transmission.

Each DC power transmission medium may be any medium that is capable of transmitting electrical power between two or more converters. Such a medium may be, but is not limited to, a submarine DC power transmission cable, an overhead DC power transmission line or cable and an underground DC power transmission cable.

It will be appreciated that the invention may include a single monitoring device or a plurality of monitoring devices. The plurality of monitoring devices in combination may form a monitoring system.

It will be appreciated that the configuration of the controller may vary depending on specific requirements of the bipolar DC power transmission scheme. For example, the controller may include a global control unit for controlling a plurality of converters, at least one local control unit for controlling at least one converter, or a combination thereof. The global control unit may be located remotely from each converter and may be configured to communicate with each converter via telecommunications links. The or each local control unit may be located in the vicinity of at least one converter. The global control unit may be configured to communicate with at least one local control unit via telecommunications links. When the controller includes a plurality of control units, the control units in combination may form a control system.

The monitoring device may be formed integrally with or separately from the controller.

In embodiments of the invention, blocking the one or more of the plurality of first and second converters in response to the fault occurring on either of the first and second DC poles may include blocking only the or each one of the plurality of first and second converters that is subjected to an overcurrent. This provides a means to ensure that each of the converters connected to the healthy DC pole are temporarily blocked only when it is subjected to an overcurrent. This is particularly advantageous under circumstances in which, for certain locations of the fault along the faulty one of the first and second DC poles, the mutual coupling between the faulty and healthy DC poles results in an undercurrent in one or more converters connected to the healthy DC pole. Programming the controller in this manner therefore prevents unwanted blocking of one or more converters that is connected to the healthy DC pole.

In further embodiments of the invention, blocking the one or more of the plurality of first and second converters in response to the fault occurring on either of the first and second DC poles may include blocking all of the plurality of first and second converters. Programming the controller in this manner ensures that all of the converters connected to the healthy DC pole are temporarily blocked in response to the fault on the faulty one of the first and second DC poles.

The fault may be, but is not limited to, a DC pole-to-ground fault.

Blocking the one or more of the plurality of first and second converters in response to the fault occurring on either of the first and second DC poles may include blocking the one or more of the plurality of first and second converters in response to a converter current of at least one of the converters exceeding a safety current limit. This provides a reliable means to ensure that the one or more of the plurality of first and second converters are blocked in response to the fault occurring on either of the first and second DC poles.

The bipolar DC power transmission scheme may further include a plurality of circuit interruption devices, whereby each circuit interruption device is arranged to be selectively operable to clear a respective one of the DC power transmission media. The controller may be programmed to send an open command to the or each corresponding circuit interruption device to clear the DC power transmission medium corresponding to the identified faulty one of the first and second DC poles on which the fault has occurred. Each circuit interruption device may be, for example, an AC circuit breaker.

The monitoring device may be configured in a variety of ways to identify the faulty one of the first and second DC poles on which the fault has occurred. For example, the monitoring device may be configured to identify the faulty one of the first and second DC poles on which the fault has occurred by one or more of: wherein the bipolar DC power transmission scheme includes a current return path, monitoring the direction of current in the current return path; monitoring the voltage profile of at least one of the plurality of first and second converters when blocked; monitoring the rate of rise of converter current of at least one of the plurality of first and second converters; monitoring the magnitude of converter current of at least one of the plurality of first and second converters.

The monitoring device may include, for example, one or more current sensors and/or one or more voltage sensors.

The monitoring device may be further configured to identify the faulty one of the first and second DC poles on which the fault has occurred by monitoring the direction of current in the current return path only when the current flowing in the current return path exceeds a predefined current threshold. This reduces the risk of incorrect identification of a fault on one of the first and second DC poles.

When at least one of the plurality of first and second converters is configured to operate in a power control mode, the controller may be programmed to initiate the deblocking of the or each blocked converter configured to operate in the power control mode at a power level which is the same or substantially the same as the minimum power level reached by that converter when blocked. This ensures a smooth transition of the operation of the or each blocked converter configured to operate in the power control mode from the blocked state to the deblocked state.

The controller may be programmed to deblock the or each blocked converter connected to the healthy other of the first and second DC poles following a time delay after the blocking of the one or more of the plurality of first and second converters in response to the fault occurring on either of the first and second DC poles.

The time delay may vary with the length of the DC power transmission medium, i.e. the longer the DC power transmission medium, the longer the time delay. For example, the time delay may be in the range of 5 milliseconds to 10 milliseconds.

The controller may be programmed to initiate the deblocking of the or each blocked converter connected to the healthy other of the first and second DC poles in response to a converter current of the blocked converter or at least one of the blocked converters connected to the healthy other of the first and second DC poles dropping below a current trigger threshold. This provides a reliable means of controlling the deblocking of the or each converter connected to the healthy other of the first and second DC poles.

Each of the first and second plurality of converters may vary in topology.

At least one of the plurality of first and second converters may include at least one module. The or each module may include at least one switching element and at least one energy storage device. The or each switching element and the or each energy storage device in the or each module may be arranged to be combinable to selectively provide a voltage source.

The or each converter may include a plurality of modules to define a chain-link converter.

The structure of the chain-link converter (which may, for example, comprise a plurality of series-connected modules) permits build-up of a combined voltage across the chain-link converter, which is higher than the voltage available from each of its individual modules, via the insertion of the energy storage devices of multiple modules, each providing its own voltage, into the chain-link converter. In this manner the chain-link converter is capable of providing a stepped variable voltage source, which permits the generation of a voltage waveform across the chain-link converter using a step-wise approximation. As such the chain-link converter is capable of providing a range of complex voltage waveforms.

The or each module may vary in structure. For example, the or each module may include a pair of switching elements connected in parallel with an energy storage device in a half-bridge arrangement to define a 2-quadrant unipolar module that can provide zero or positive voltages and can conduct current in two directions.

According to a second aspect of the invention, there is provided a method of operating a bipolar DC power transmission scheme, the bipolar DC power transmission scheme including first and second DC poles, each DC pole including a respective DC power transmission medium extending between two ends, the bipolar DC power transmission scheme further including a plurality of first converters and a plurality of second converters, wherein each end of the DC power transmission medium of the first DC pole is respectively operatively connected to at least one of the plurality of first converters, and each end of the DC power transmission medium of the second DC pole is respectively operatively connected to at least one of the plurality of second converters, the method comprising the steps of: blocking one or more of the plurality of first and second converters in response to a fault occurring on either of the first and second DC poles; identifying the faulty one of the first and second DC poles on which the fault has occurred; and after identifying the faulty one of the first and second DC poles on which the fault has occurred, deblocking the or each blocked converter connected to the healthy other of the first and second DC poles.

The features and advantages of the bipolar DC power transmission scheme of the first aspect of the invention and its embodiments apply mutatis mutandis to the method of the second aspect of the invention.

It will be appreciated that the use of the terms "first" and "second" in the patent specification is merely intended to help distinguish between similar features (e.g. the first and second converters), and is not intended to indicate the relative importance of one feature over another feature.

BRIEF DESCRIPTION OF THE DRAWINGS

An embodiment of the invention will now be described, by way of a non-limiting example, with reference to the accompanying drawings in which.

DETAILED DESCRIPTION OF THE INVENTION

Figure 1:
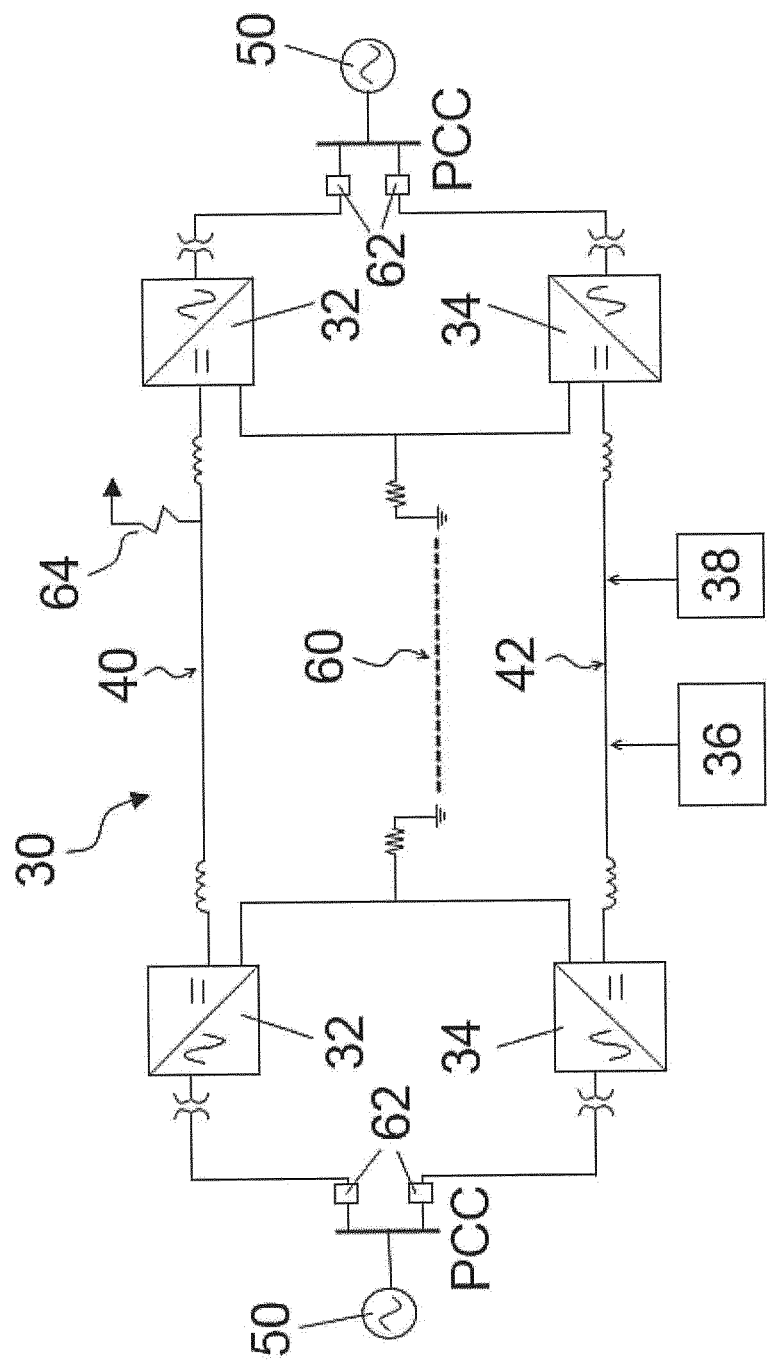
FIG. 1 shows schematically the layout of a bipolar DC power transmission scheme.

A bipolar DC power transmission scheme according to an embodiment of the invention is shown in FIG. 1 and is designated generally by the reference numeral 30.

The bipolar DC power transmission scheme 30 comprises first and second DC poles, a plurality of first converters 32, a plurality of second converters 34, a controller 36 and a monitoring device 38.

For the purposes of simplicity, the bipolar DC power transmission scheme 30 of FIG. 1 is described with reference to a controller 36 based on a single control unit and a single monitoring device 38. As explained above, a plurality of control units may be used in placed of the single control unit, and a plurality of monitoring devices may be used in place of the single monitoring device 38.

The first DC pole includes a first DC power transmission line 40 extending between first and second ends. The second DC pole includes a second DC power transmission line 42 extending between first and second ends.

Figure 2:
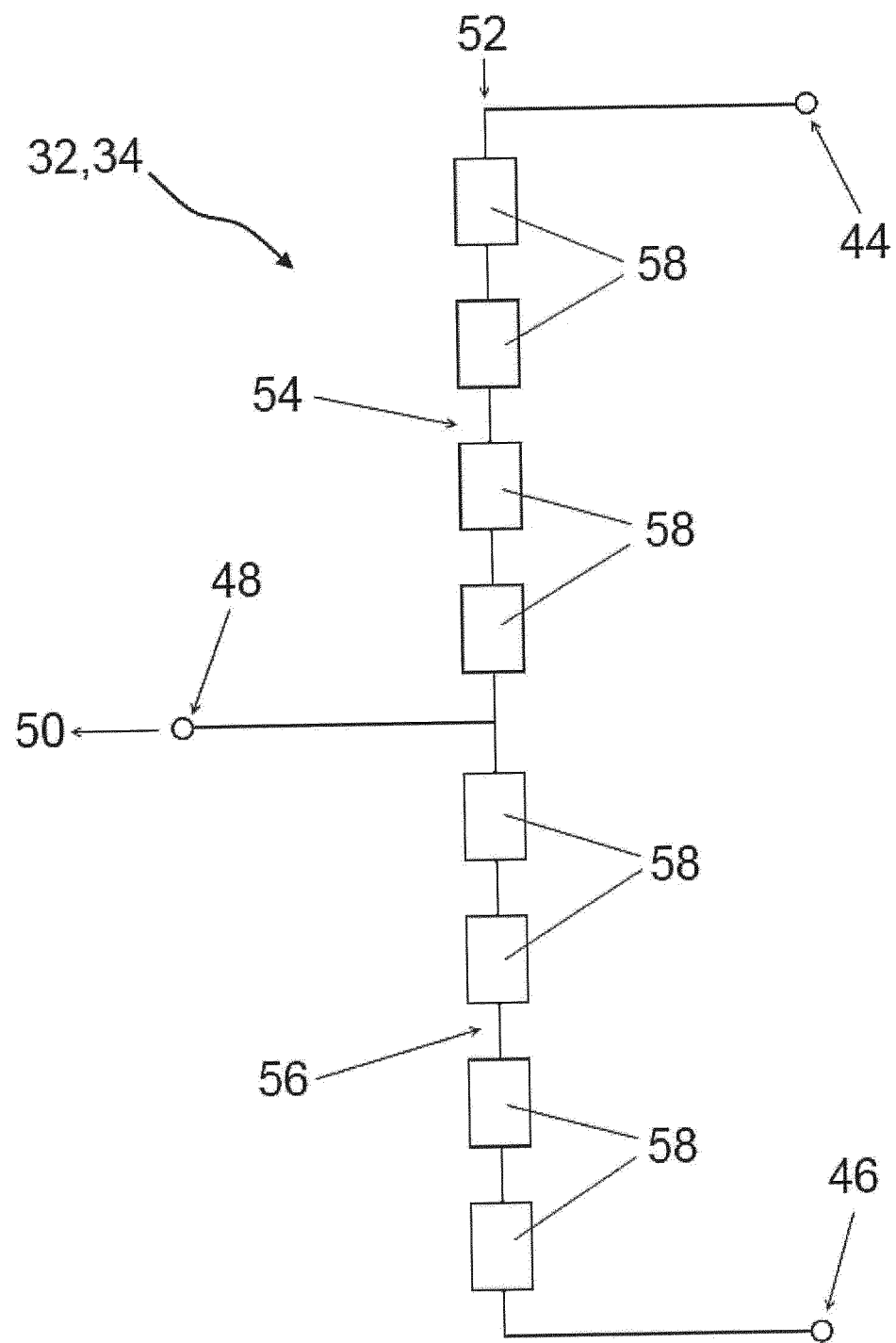
FIG. 2 shows schematically the structure of a converter of the bipolar power DC transmission scheme of FIG. 1.

Each converter 32,34 includes a first DC terminal 44 and a second DC terminal 46. In addition each converter 32,34 shown in FIG. 1 includes a plurality of AC terminals 48, each of which in use is connected to a respective phase of a respective multi-phase AC network 50. More particularly, each converter 32,34 shown in FIG. 1 defines an AC/DC voltage source converter 32,34 which includes a plurality of converter limbs 52, each of which is arranged as shown in FIG. 2.

Each converter limb 52 extends between the first and second DC terminals 44,46, and includes a first limb portion 54 that extends between the first DC terminal 44 and the AC terminal 48, and a second limb portion 56 which extends between the second DC terminal 46 and the AC terminal 48.

Figure 3:
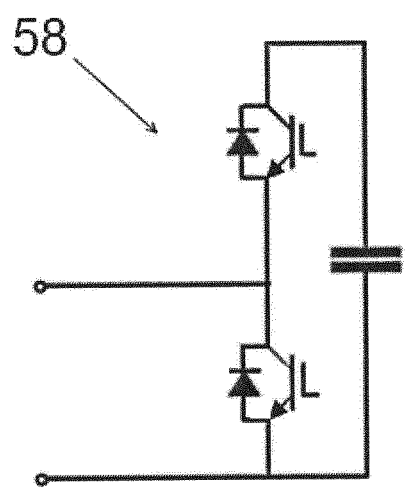
FIG. 3 shows schematically the structure of a module of the converter of FIG. 2.

Each limb portion 56,58 includes a plurality of series-connected modules 58 to define a chain-link converter. In the specific embodiment shown, each module 58 includes a pair of switching elements that are connected in parallel with a capacitor in a half-bridge arrangement to define a 2-quadrant unipolar module 58 that can provide zero or positive voltages and can conduct current in two directions, as shown in FIG. 3.

Each switching element constitutes an insulated gate bipolar transistor (IGBT), which is connected in parallel with an anti-parallel passive current check element in the form of a diode.

It is envisaged that, in other embodiments of the invention, the IGBT may be replaced by one or more other semiconductor switches, the diode may be replaced by another type of passive current check element that limits current flow to only one direction, and/or each capacitor may be replaced by another type of energy storage device that is capable of storing and releasing energy, e.g. a fuel cell or battery.

It will be appreciated that the topology of each converter 32,34 is merely chosen to help illustrate the operation of an embodiment of the invention, and that each converter 32,34 may be replaced by another converter with a different topology.

The first end of the first DC power transmission line 40 is operatively connected to the first DC terminal 44 of one of the plurality of first converters 32, and the second end of the first DC power transmission line 40 is operatively connected to the first DC terminal 44 of another of the plurality of first converters 32. The first end of the second DC power transmission line 42 is operatively connected to the first DC terminal 44 of one of the plurality of second converters 34, and the second end of the second DC power transmission line 42 is operatively connected to the first DC terminal 44 of another of the plurality of second converters 34.

The second DC terminals 46 of the ones of the plurality of first and second converters 32,34 are operatively connected via a current return path 60 to the second DC terminals 46 of the others of the plurality of first and second converters 32,34. The current return path 60 may be an electrode line or a metallic return. It will be appreciated that the current return path 60 is optional.

The bipolar DC power transmission scheme 30 further includes a plurality of AC circuit breakers 62. Each AC circuit breaker 62 is connected at an AC side of each converter 32,34. In this manner each AC circuit breaker 62 is arranged to be selectively operable to clear the corresponding DC power transmission line 40,42.

The controller 36 is programmed to control the switching of the switching elements of the modules 58 of each converter 32,34 in order to operate each module 58 to selectively provide a voltage source. The controller 36 is further programmed to selectively send an open command to each AC circuit breaker 62 to open to clear the corresponding DC power transmission line 40,42.

The configuration of the controller 36 may vary depending on specific requirements of the bipolar DC power transmission scheme 30. For example, the controller 36 may include a global control unit for controlling a plurality of converters 32,34, at least one local control unit for controlling at least one converter 32,34, or a combination thereof. The global control unit may be located remotely from each converter 32,34 and may be configured to communicate with each converter 32,34 via telecommunications links. The or each local control unit may be located in the vicinity of at least one converter 32,34. The global control unit may be configured to communicate with at least one local control unit via telecommunications links.

During normal operation of the bipolar DC power transmission scheme 30, the controller 36 controls the switching of the switching elements of the modules 58 of each converter 32,34 in order to operate each converter 32,34 to perform a power conversion operation to transfer power between its AC and DC terminals 50,44,46. Such operation results in the transmission of power between the multi-phase AC networks 50, which includes the transmission of power along the DC power transmission lines 40,42 between the converters 32,34.

One of the first and second DC power transmission lines 40,42 may experience a DC pole-to-ground fault 64 during the operation of the bipolar DC power transmission scheme 30. It is desirable for the healthy DC pole to continue transmitting power using the current return path 60 during the DC pole-to-ground fault 64. This can be normally achieved through the conventional response which includes blocking of the converters 32,34 connected to the faulty DC pole and tripping the associated AC circuit breakers 62 to clear the faulty DC pole.

For each converter 32,34 connected to the faulty DC pole, the pole to ground fault 64 on one DC pole has the effect of a DC pole-to-DC pole fault. This results in the flow of a heavy fault current with a high rate of rise of current.

The use of the IGBT and anti-parallel diode pairs in each half-bridge module 58 means that each converter 32,34 connected to the faulty DC pole is unable to prevent the fault current from flowing from the corresponding AC network 50, through the diodes of the half-bridge modules 58 of the converter and to the fault 64. This results in a voltage drop of the point of common coupling connected to the AC side of each converter 32,34 connected to the faulty DC pole until the corresponding AC circuit breaker 62 is opened, which typically takes 2-3 cycles to take place.

The mutual coupling between the faulty and healthy DC poles may result in strong dynamics in the converters 32,34 connected to the healthy DC pole that leads to overcurrent and/or overvoltage. For example, the high rate of rise of current in the faulty DC pole may induce a corresponding voltage in the healthy DC pole, thus resulting in heavy transients in the healthy DC pole.

Depending on the location of the fault in the faulty DC pole, the mutual coupling effect may results in an overcurrent in each converter 32,34 connected to the healthy DC pole, which in turn could lead to an overvoltage of the capacitor of each corresponding module 58. In addition the increase in current transient in the healthy DC pole may inadvertently trigger an overcurrent protection scheme 30 to take effect. Moreover, if the voltage level of the capacitor of each module 58 continues to stay above a safety voltage limit, it may not be possible to safely discharge the capacitor, for example using discharge resistors.

A method of operating the bipolar DC power transmission scheme 30 of FIG. 1 is described as follows.

For the purposes of illustrating the working of embodiments of the invention, it is assumed that the DC pole-to-ground fault 64 occurs on the first DC pole, but it will be understood that the following description applies mutatis mutandis to the occurrence of the DC pole-to-ground fault 64 on the second DC pole.

The occurrence of the fault 64 in the bipolar DC power transmission scheme 30 may be detected in a number of ways. For example, the fault 64 may be detected by way of a converter current of at least one of the converters 32,34 exceeding a safety current limit.

In response to the fault 64 occurring on the first DC pole, the controller 36 controls the switching of the switching elements of the modules 58 to block all of the plurality of first and second converters 32,34 in response to a fault occurring on either of the first and second DC poles. This has the effect of interrupting the power transmission operation of the bipolar DC power transmission scheme 30.

Following the blocking of the plurality of first and second converters 32,34, the monitoring device 38 is configured to identify the one faulty of the first and second DC poles on which the fault 64 has occurred. In this regard the monitoring device 38 is configured to include one or more suitable sensors (e.g. current and/or voltage sensors) to identify the faulty DC pole through one or more of: monitoring the direction of current in the current return path 60; monitoring the voltage profile of at least one of the plurality of first and second converters 32,34 when blocked; monitoring the rate of rise of converter current of at least one of the plurality of first and second converters 32,34; monitoring the magnitude of converter current of at least one of the plurality of first and second converters 32,34.

The faulty DC pole can be identified by monitoring the direction of current in the current return path 60, because the direction of fault current for when the first DC pole is the faulty DC pole will be opposite to the direction of fault current for when the second DC pole is the faulty DC pole. The monitoring device 38 may be further configured to identify the faulty one of the first and second DC poles on which the fault 64 has occurred by monitoring the direction of current in the current return path 60 only when the current flowing in the current return path 60 exceeds a predefined current threshold. This reduces the risk of incorrect identification of a fault 64 on one of the first and second DC poles.

Once the faulty DC pole is identified, an open command is sent by the controller 36 to the corresponding AC circuit breakers 62 to open to clear the faulty DC pole, which in this example is the first DC pole.

Following a time delay after the blocking of the converters 32,34, the controller 36 controls the switching of the switching elements of the modules 58 of the blocked converters 34 connected to the healthy DC pole, i.e. the second converters 34, in order to deblock the blocked converters 34 connected to the healthy DC pole. As mentioned above, the time delay may vary with the length of the DC power transmission line 42, i.e. the longer the DC power transmission line 42, the longer the time delay, and may be in the range of 5 milliseconds to 10 milliseconds. In addition, as a means of controlling the deblocking of the blocked second converters 34, the controller 36 is programmed to initiate the deblocking of the blocked second converters 34 in response to a converter current of each blocked second converter 34 dropping below a current trigger threshold.

The deblocking of the blocked second converters 34 involves resetting a number of control loops of the blocked second converters 34. For a blocked second converter 34 configured to operate in a power control mode, the controller 36 is programmed to initiate the deblocking of that second converter 34 at a power level which is the same or substantially the same as the minimum power level reached by that second converter 34 when blocked. For example, if the power level of that second converter 34 dropped to 0.7 per unit when blocked, the power order given to that second converter 34 at deblocking is set as 0.7 per unit.

The deblocked second converters 34 then resume their normal power conversion operation to enable the second DC pole to continue transmitting power using the current return path 60 during the DC pole-to-ground fault 64, thus enabling the bipolar DC power transmission scheme 30 to resume its power transmission operation.

The configuration of the bipolar DC power transmission scheme 30 therefore permits temporary blocking of the converters 32,34 connected to the healthy DC pole in the event of the DC pole-to-ground fault 64 on the other DC pole and thereby reduce the adverse effects resulting from the mutual coupling between the faulty and healthy DC poles. This thereby permits operation of the converters 32,34 connected to the healthy DC pole within safe operating limits whilst minimising power transmission interruption.

FIGS. 4a to 7b compares, in graphical form, the variations in electrical characteristics of the converters 34 connected to the healthy DC pole when using (a) the conventional response that involves blocking the converters 34 connected to the faulty DC pole and tripping associated circuit breakers 62 to clear the faulty DC pole, and (b) the above-described method of embodiments the invention. In each of FIGS. 4a to 7b, the fault 64 is applied at t=2 seconds. With respect of the conventional response, the converters 34 connected to the healthy DC pole, i.e. the second converters 34, are allowed to continue transmitting power. With respect to the method of an embodiment of the invention, the second converters 34 are deblocked after 10 milliseconds from when the converters 32,34 connected to both DC poles are blocked, and the power order given to the second converters 34 is set at 0.65 per unit.

Figure 4A:
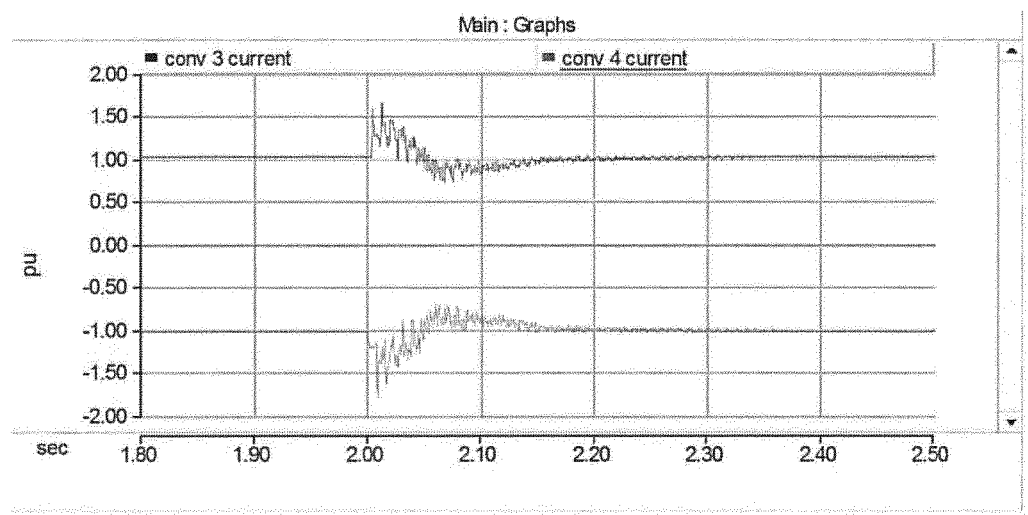
FIGS. 4a to 7b compares, in graphical form, the variations in electrical characteristics of converters connected to a healthy DC pole when using the conventional response and method.
Figure 4B:
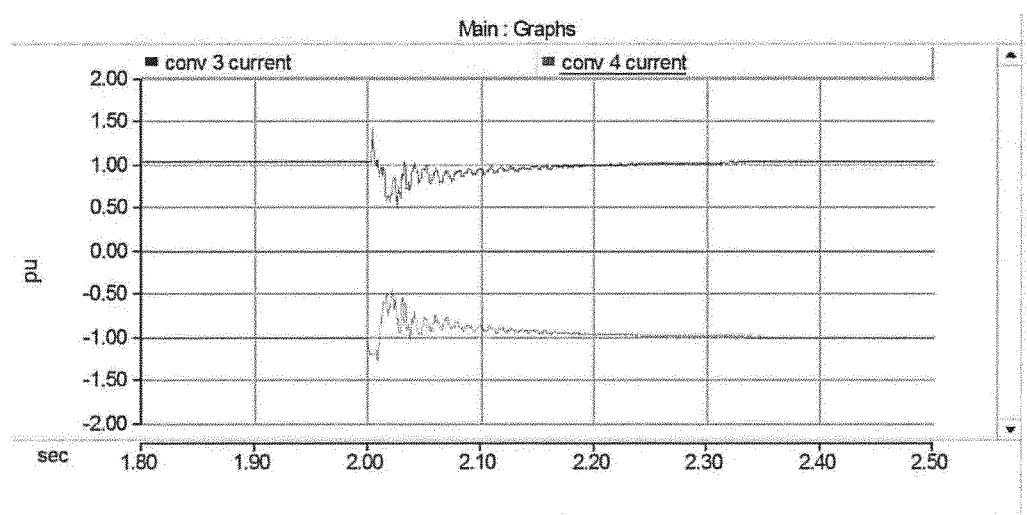

FIGS. 4a and 4b compares, in graphical form, the variations in converter current of the second converters 34 when using (a) the conventional response, as shown in FIG. 4a, and (b) the above-described method, as shown in FIG. 4b. It can be seen that the application of the method results in a smaller current transient in the second converters 34 when compared to the conventional response.

Figure 5A:
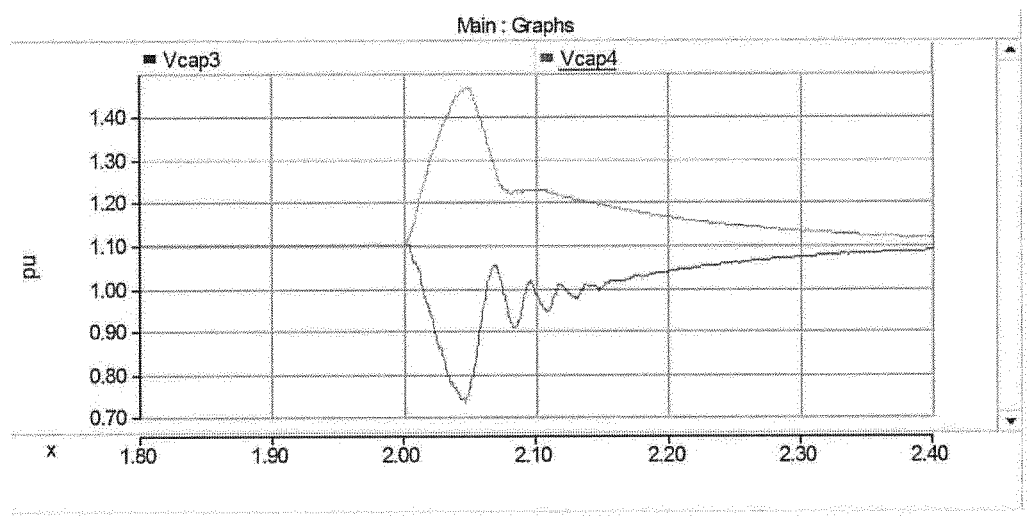
Figure 5B:
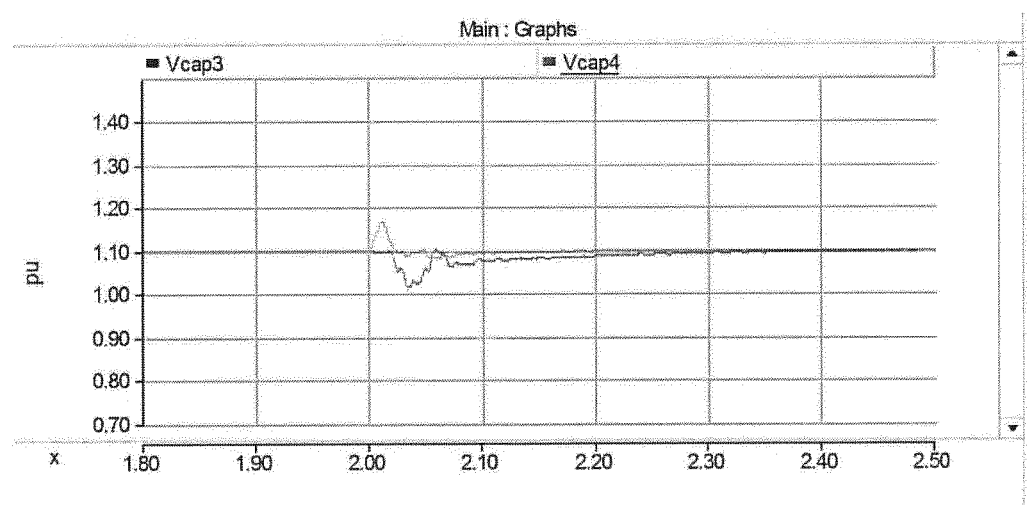

FIGS. 5a and 5b compares, in graphical form, the variations in voltage of the capacitors of the modules 58 of the second converters 34 when using (a) the conventional response, as shown in FIG. 5a, and (b) the above-described method, as shown in FIG. 5b. It can be seen that the application of the method results in a smaller increase in voltage of the capacitors of the modules 58 of the second converters 34 when compared to the conventional response.

Figure 6A:
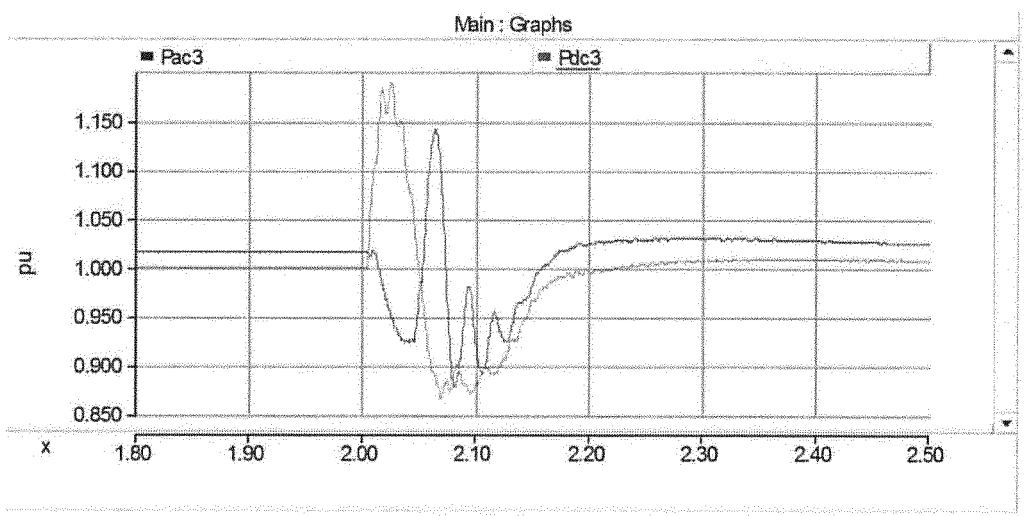
Figure 6B:
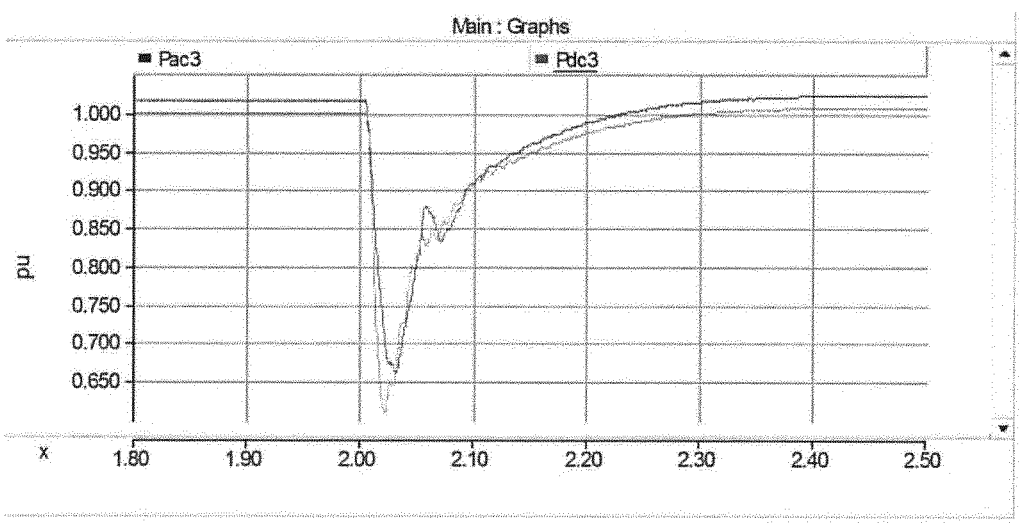
Figure 7A:
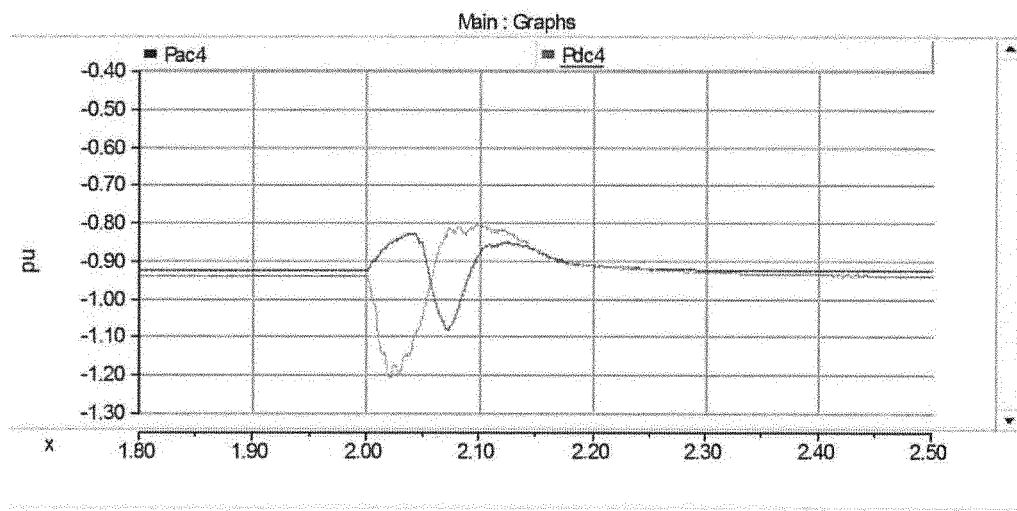
Figure 7B:
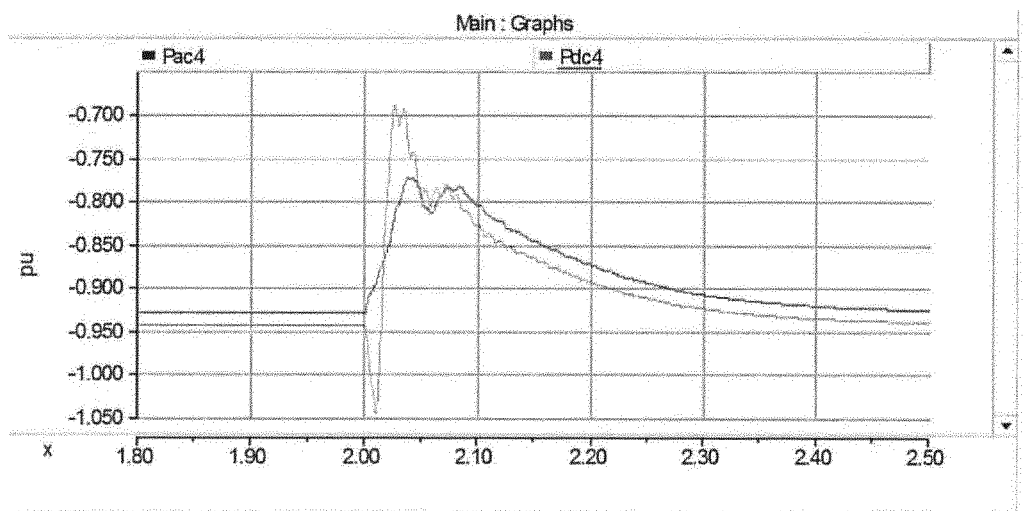

FIGS. 6a and 6b compares, in graphical form, the variations in AC and DC power for one of the second converters 34 when using (a) the conventional response, as shown in FIG. 6a, and (b) the above-described method, as shown in FIG. 6b. FIGS. 7a and 7b compares, in graphical form, the variations in AC and DC power for the other of the second converters 34 when using (a) the conventional response, as shown in FIG. 7a, and (b) the above-described method, as shown in FIG. 7b. It can be seen from FIGS. 6a, 6b, 7a and 7b that the application of the method results in a minimal interruption in the order of milliseconds to the transmission of AC and DC power.

It is envisaged that, in other embodiments of the invention, the controller may be programmed to block one or some of the plurality of first and second converters 32,34, instead of all of the of the plurality of first and second converters 32,34, in response to the fault 64 occurring on either of the first and second DC poles.

It is also envisaged that, in still other embodiments of the invention, blocking the one or more of the plurality of first and second converters 32,34 in response to the fault occurring on either of the first and second DC poles block may include blocking only the or each one of the plurality of first and second converters 32,34 that is subjected to an overcurrent, which may be detected by the monitoring device 38 or by another current sensing device. This provides a means to ensure that each of the converters 32,34 connected to the healthy DC pole are temporarily blocked only when it is subjected to an overcurrent. This is particularly advantageous under circumstances in which, for certain locations of the fault 64 along the faulty DC pole, the mutual coupling between the faulty and healthy DC poles results in an undercurrent in one or more converters 32,34 connected to the healthy DC pole. Programming the controller in this manner therefore prevents unwanted blocking of one or more converters 32,34 that is connected to the healthy DC pole.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What we claim is:

1. A bipolar DC power transmission scheme comprising:
   first and second DC poles, each DC pole including a respective power DC transmission medium extending between two ends;
   a plurality of first converters and a plurality of second converters, wherein each end of the DC power transmission medium of the first DC pole is respectively operatively connected to at least one of the plurality of first converters, and each end of the DC power transmission medium of the second DC pole is respectively operatively connected to at least one of the plurality of second converters;
   a monitoring device configured to identify a faulty pole, wherein the faulty pole comprises one of the first and second DC poles; and
   a controller programmed to block, based on the monitoring device identifying the faulty pole, one or more of the plurality of first and second converters connected to a healthy other of the first and second DC poles, wherein only the one or more of the plurality of first and second converters connected to a healthy other of the first and second DC poles that are subject to an overcurrent based on a relative location to the fault on the faulty pole are blocked,
   wherein the controller is further programmed to deblock the blocked one or more of the plurality of first and second converters connected to the healthy other of the first and second DC poles after the monitoring device has identified the faulty pole,
   wherein the bipolar DC power transmission scheme includes a current return path, monitoring a direction of current in the current return path, and
   wherein the monitoring device is configured to identify the faulty one of the first and second DC poles on which the fault has occurred by monitoring the direction of current in the current return path only when the current flowing in the current return path exceeds a predefined current threshold.

2. The bipolar DC power transmission scheme according to claim 1 wherein blocking the one or more of the plurality of first and second converters in response to the fault occurring on either of the first and second DC poles includes blocking all of the plurality of first and second converters.

3. The bipolar DC power transmission scheme according to claim 1 wherein the fault is a DC pole-to-ground fault.

4. The bipolar DC power transmission scheme according to claim 1 wherein blocking the one or more of the plurality of first and second converters in response to the fault occurring on either of the first and second DC poles includes blocking the one or more of the plurality of first and second converters in response to a converter current of at least one of the converters exceeding a safety current limit.

5. The bipolar DC power transmission scheme according to claim 1 further including a plurality of circuit interruption devices, each circuit interruption device arranged to be selectively operable to clear a respective one of the DC transmission media, wherein the controller is programmed to send an open command to the or each corresponding circuit interruption device to clear the DC power transmission medium corresponding to the identified faulty one of the first and second DC poles on which the fault has occurred.

6. The bipolar DC power transmission scheme according to claim 1 wherein the monitoring device is configured to identify the faulty one of the first and second DC poles on which the fault has occurred by one or more of:
   monitoring a voltage profile of at least one of the plurality of first and second converters when blocked;
   monitoring a rate of rise of converter current of at least one of the plurality of first and second converters; and
   monitoring a magnitude of converter current of at least one of the plurality of first and second converters.

7. The bipolar DC power transmission scheme according to claim 6 wherein at least one of the plurality of first and second converters is configured to operate in a power control mode, and wherein the controller is programmed to initiate the deblocking of the or each blocked converter configured to operate in the power control mode at a power level which is the same or substantially the same as the minimum power level reached by that converter when blocked.

8. The bipolar DC power transmission scheme according to claim 6 wherein the controller is programmed to deblock the or each blocked converter connected to the healthy other of the first and second DC poles following a time delay after the blocking of the one or more of the plurality of first and second converters in response to the fault occurring on either of the first and second DC poles.

9. The bipolar DC power transmission scheme according to claim 8 wherein the time delay is in a range of 5 milliseconds to 10 milliseconds.

10. The bipolar DC power transmission scheme according to claim 6 wherein the controller is programmed to initiate the deblocking of the or each blocked converter connected to the healthy other of the first and second poles in response to a converter current of the blocked converter or at least one of the blocked converters connected to the healthy other of the first and second DC poles dropping below a current trigger threshold.

11. The bipolar DC power transmission scheme according to claim 6 wherein at least one of the plurality of first and second converters includes at least one module, the or each module including at least one switching element and at least one energy storage device, the or each switching element and the or each energy storage device in the or each module arranged to be combinable to selectively provide a voltage source.

12. The bipolar DC power transmission scheme according to claim 11 wherein the or each module includes a pair of switching elements connected in parallel with an energy storage device in a half-bridge arrangement to define a 2-quadrant unipolar module that can provide zero or positive voltages and can conduct current in two directions.

13. A method of operating a bipolar DC power transmission scheme, the bipolar DC power transmission scheme including first and second DC poles, each DC pole including a respective DC power transmission medium extending between two ends, the bipolar DC power transmission scheme further including a plurality of first converters and a plurality of second converters, wherein each end of the DC power transmission medium of the first DC pole is respectively operatively connected to at least one of the plurality of first converters, and each end of the DC power transmission medium of the second DC pole is respectively operatively connected to at least one of the plurality of second converters, the method comprising:
    identifying a faulty pole, wherein the faulty pole comprises one of the first and second DC poles;
    blocking, based on identifying the faulty pole, one or more of the plurality of first and second converters connected to a healthy other of the first and second DC poles, wherein only the one or more of the plurality of first and second converters connected to a healthy other of the first and second DC poles that are subject to an overcurrent based on a relative location to the fault on the faulty pole are blocked; and
    deblocking the blocked one or more of the plurality of first and second converters connected to the healthy other of the first and second DC poles after identification of the faulty pole,
    wherein the bipolar DC power transmission scheme includes a current return path, monitoring a direction of current in the current return path; and
    wherein a monitoring device is configured to identify the faulty one of the first and second DC poles on which the fault has occurred by monitoring the direction of current in the current return path only when the current flowing in the current return path exceeds a predefined current threshold.

* * * * *